United States Patent
Mitchell et al.

(10) Patent No.: US 7,897,944 B2
(45) Date of Patent: Mar. 1, 2011

(54) METHOD AND APPARATUS FOR MEASUREMENT OF BEAM ANGLE IN ION IMPLANTATION

(75) Inventors: Robert J. Mitchell, Winchester, MA (US); Bo H. Vanderberg, Gloucester, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 195 days.

(21) Appl. No.: 12/176,748

(22) Filed: Jul. 21, 2008

(65) Prior Publication Data

US 2010/0012861 A1   Jan. 21, 2010

(51) Int. Cl.
*H01J 37/304* (2006.01)

(52) U.S. Cl. .................................. 250/492.21

(58) Field of Classification Search ............ 250/492.21, 250/397
See application file for complete search history.

(56) References Cited

U.S. PATENT DOCUMENTS

| 6,437,350 B1 | 8/2002 | Olson et al. |
| 6,677,598 B1 * | 1/2004 | Benveniste ............. 250/492.21 |
| 6,828,572 B2 | 12/2004 | Reece et al. |
| 6,872,953 B1 | 3/2005 | Benveniste |
| 6,989,545 B1 | 1/2006 | Rathmell et al. |
| 6,998,625 B1 | 2/2006 | McKenna et al. |
| 7,064,340 B1 | 6/2006 | Vanderberg et al. |
| 7,078,712 B2 | 7/2006 | Perel et al. |
| 7,329,882 B2 * | 2/2008 | Rathmell et al. ....... 250/492.21 |
| 7,394,073 B2 * | 7/2008 | Cummings et al. .......... 250/397 |
| 7,399,980 B2 * | 7/2008 | Vanderberg et al. .... 250/492.21 |

* cited by examiner

*Primary Examiner*—Kiet T Nguyen
(74) *Attorney, Agent, or Firm*—Eschweiler & Associates, LLC (57) ABSTRACT

An ion beam angle detection apparatus, comprising a linear drive assembly fixedly attached to a moveable profiler assembly, wherein the profiler assembly comprises, a profiler having a profiler aperture formed within a profiler top plate and a profiler sensor assembly, a moveable angle mask assembly comprising a moveable angle mask with a mask aperture, wherein the angle mask assembly is non-fixedly attached to the profiler assembly, the mask aperture is movable relative to the profiler aperture by energizing an mask linear drive fixedly attached to the profiler assembly and the profiler aperture is movable through a length greater than the elongated length of the ion beam.

4 Claims, 7 Drawing Sheets

METHOD AND APPARATUS FOR MEASUREMENT OF BEAM ANGLE IN ION IMPLANTATION

FIELD OF THE INVENTION

The present invention relates generally to ion implantation systems and specifically to improved methods and apparatus for measuring the beam angle distribution of an ion beam.

BACKGROUND OF THE INVENTION

In the manufacture of semiconductor devices and other products, ion implantation is used to dope semiconductor wafers, display panels, or other workpieces with impurities. Ion implanters or ion implantation systems treat a workpiece with an ion beam, to produce n or p-type doped regions or to form passivation layers in the workpiece. When used for doping semiconductors, the ion implantation system injects a selected ion species to produce the desired extrinsically doped material, wherein implanting ions generated from source materials such as antimony, arsenic or phosphorus results in n type extrinsically doped material wafers, and implanting materials such as boron or indium creates p type extrinsic material portions in a semiconductor wafer. Within the ion implantation chamber silicon wafers are physically impacted by the ion beam.

One method for ion implantation of silicon wafers uses a combination of a broad ion beam that that is wider than the maximum diameter of the wafer and a mechanism for mechanically scanning or moving the wafer in a direction that is orthogonal to the broad direction of the beam. The broad beam can be generated either as a continuous, static "ribbon" beam from an ion source or the beam can be the result of a "pencil" beam that is scanned back and forth by a beam scanning mechanism across the workpiece. The broad beam is ideally supposed to strike the wafer so that the angle between the path of the ions and the workpiece surface (i.e., angle of incidence) is the same at every point on the workpiece. However, the ions may not all be moving in the identical direction across the entire width of the wafer due to problems that are inherent in the generation and focusing of broad types of ribbon beams, for example. The resulting non-parallel paths of the ions results in implantation angle errors. A method for measuring the angle of the ions is required to verify that the implant angle error will be within a specified value or range of values before conducting the implant so that a proper process is assured.

Typically, a mask with multiple apertures has been placed in front of a beam current measuring device known as a profiler that only allows ions through it at defined locations across the broad width of the beam. If the ions are all moving in the same direction, the profiler will record beamlet positions along the profiler path identical to each aperture position as it travels behind a mask in the broad direction of the beam. In addition, if the mask is calibrated to the profiler, the overall direction of the ions can be measured, since the peak of the current measurement should occur when the profiler is positioned directly behind the mask aperture. However, if the paths of the ions are not all parallel to one another, the profiler will measure varying beamlet positions as it transverses behind the multiple apertures of the mask. One particular problem with this method is that it can only measure the beam angle at each defined aperture location. Another disadvantage lies in the need for a mask as wide as the ribbon beam it needs to measure, typically resulting in a large and costly assembly.

An exemplary prior art beam angular measurement system assists semiconductor device fabrication by measuring ion beam current and angle of incidence at various locations within an ion beam. A moveable detector is operative to provide uniformity measurements before ion implantation (e.g., performing calibration in situ during verification). Based on the various measurements, generation of the ion beam can be modified to improve uniformity. The ion implantation can be performed with improved uniformity and with tighter process controls.

Figure 1:
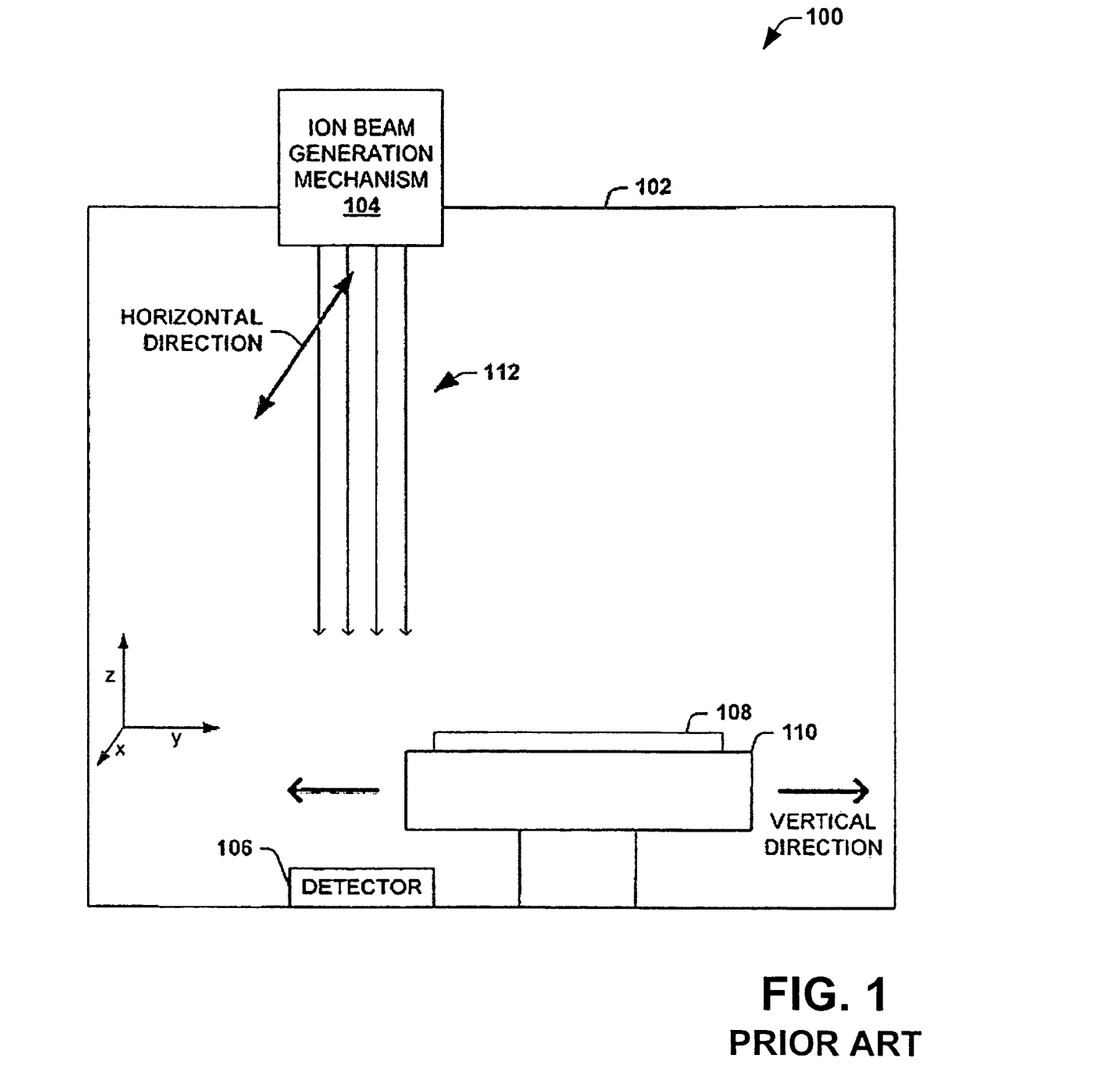
FIG. 1 is a prior art side view of a serial wafer ion implantation system; (replace detector with profiler from FIG. 5, add mask)

The prior art figure illustrated in FIG. 1 is a simplified schematic of a single wafer ion implantation system 100. The prior art system 100 contains an ion chamber 102, an ion beam generating mechanism 104, a uniformity detector 106 (should be moveable as in FIG. 5), and a pedestal or platen 110 for temporarily capturing the workpiece/wafer 108. The ion beam generating mechanism 104 normally generates a ribbon ion beam 112, with characteristics including beam current, angle of incidence, and the like. Although the ion beam 112 is depicted as being substantially orthogonal to a surface of the wafer 108, the ion beam 112 can be at other incident angles with respect to the surface of the workpiece 108. The pedestal 110 can move the wafer 108 through the ion beam 112 at a controlled velocity to achieve the preferred implantation. An ion implantation can be performed in a single pass of the wafer 108 through the ribbon ion beam 112. A uniform implantation is obtained because the entire wafer 108 moves through the ion beam 112 at about the same rate.

The uniformity detector is typically parked outside of the ion beam until it is used. This prior art device can include any suitable number of detectors, detectors located at other positions, and movable detectors. The detector 106 may be reside in substantially the same plane as the wafer 108. The detector 106 measures uniformity of beam current across the width of the ion beam 112 at a finite number of locations. When combined with an angle mask, typically as wide as the wafer and positioned in the beam such that only a few beamlets pass through the mask, the prior art detector 106 can acquire angle of incidence measurements of the ion beam 112 at the finite number of locations and the beam current uniformity and angle of incidence measurements can be utilized to adjust the ion beam 112 to improve uniformity. Additionally, these measurements can be used to determine potential damage to the wafer when the measurements depict substantial deviations from desired properties. One of the difficulties with this approach is that the mask has a predetermined number of slots and therefore the angle of incidence can only be measured along a portion of the ion beam and not the entire beam 112.

Another exemplary detector, described in U.S. Pat. No. 6,989,545 includes a series of elements that respectively include an aperture and a pair of beam current sensors. The aperture permits only a portion of the ion beam 112, referred to as a beamlet, to pass through to impact the pair of beam current sensors. The sum of beam currents measured by each of the pair of sensors is employed to determine a total beam current at the aperture location, and an angle of incidence of the beamlet can be calculated from the difference of beam currents of each sensor. Accordingly, the measurements of the elements can then be used to determine uniformity of the ion beam and each of the elements can be utilized to obtain an angle of incidence measurement throughout the ion beam 112.

Based on these angular measurements, corrective actions can be taken to improve angle uniformity of the ion beam 208.

Figure 2:
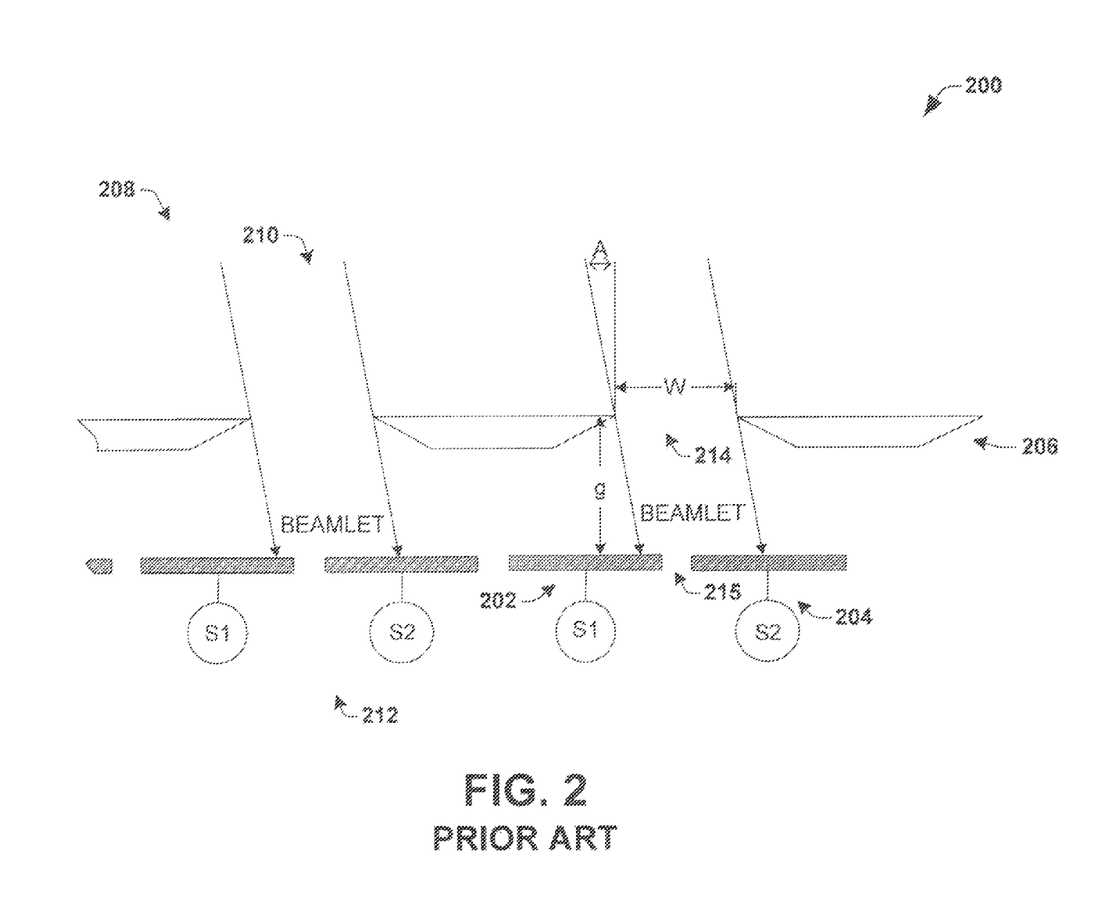
FIG. 2 is a prior art ion beam side view of the serial wafer ion implantation system utilizing an beam angle measurement apparatus.

Both of the systems mentioned supra have problems associated with them. Prior art FIG. 1 measures the beam angle only at the location of slots in the mask. One particular problem with prior art FIG. 2 is that it can only measure the beam angle at each of the defined aperture locations, and the beam angle is not measured continuously.

Therefore, a need exists in the art for a method and system that generally decreases the aforementioned issues and provides for measuring the beam angle at any point along the broad direction of the beam.

SUMMARY OF THE INVENTION

The following presents a simplified summary of the invention in order to provide a basic understanding of some aspects of the invention. This summary is not an extensive overview of the invention, and is neither intended to identify key or critical elements of the invention nor to delineate the scope of the invention. Rather, the purpose of the summary is to present some concepts of the invention in a simplified form as a prelude to the more detailed description that is presented later.

The present invention is related to ion implantation systems, scanning systems, and methods for providing scanned ion beams to a workpiece, in which one or more focusing properties of an ion beam are adjusted or corrected dynamically to compensate for a time varying focal property of a scanning mechanism. The invention finds utility in any type of ion implantation application, and may be advantageously employed to mitigate incident beam variations along a scan direction, thereby improving implantation uniformity in implanted workpieces.

In accordance with an aspect of the invention, an ion beam angle detection apparatus, comprising a linear drive assembly fixedly attached to a moveable profiler assembly, wherein the profiler assembly comprises, a profiler having a profiler aperture formed within a profiler top plate and a profiler sensor assembly, a moveable angle mask assembly comprising a moveable angle mask with a mask aperture, wherein the angle mask assembly is non-fixedly attached to the profiler assembly, the mask aperture is movable relative to the profiler aperture by energizing a linear drive fixedly attached to the profiler assembly and the profiler assembly is movable in the x-axis through a length greater than the width of the ribbon ion beam.

Another aspect of the invention relates to an ion implantation system, comprising an ion source operable to produce an extracted ion beam, a mass analyzer receiving the extracted ion beam from the ion source and providing a mass analyzed ion beam comprising ions of a desired mass range, an ion beam angle detection apparatus, comprising a linear drive assembly fixedly attached to a moveable profiler assembly, wherein the profiler assembly comprises, a profiler having a profiler aperture formed within a profiler top plate and a profiler sensor assembly, a moveable angle mask assembly comprising a moveable angle mask with a mask aperture, wherein the angle mask assembly is non-fixedly attached to the profiler assembly, the mask aperture is movable relative to the profiler aperture by energizing a linear drive fixedly attached to the profiler assembly and the profiler assembly is movable through a length greater than the elongated length of the ion beam, an end station receiving the mass analyzed ion beam from the beamline system and supporting at least one workpiece along the path for implantation using the mass analyzed ion beam.

Yet another aspect of the invention relates to a method of determining an actual ion beam angle of incidence, comprising positioning profiler assembly at the beginning edge of a ribbon ion beam. The profiler is moved across the ribbon ion beam while moving a mask rapidly back and forth about the profiler. Profiler signals are collected as a function of time during travel of the profiler determining if measured angles are acceptable. Adjustments are made to the ion beam. If the measured angles of incidence are unacceptable the method returns to the beginning, or else the method ends.

The following description and annexed drawings set forth in detail certain illustrative aspects and implementations of the invention. These are indicative of but a few of the various ways in which the principles of the invention may be employed.

DETAILED DESCRIPTION OF THE INVENTION

The present invention will now be described with reference to the drawings wherein like reference numerals are used to refer to like elements throughout, and wherein the illustrated structures are not necessarily drawn to scale. The invention facilitates ion implantation in semiconductors by monitoring and correcting angular errors via an incident angle ion beam angle detector. The actual beam angle can be calculated from the resulting geometry of a mask and a profiler aperture, for example. Also, the method disclosed in this invention can facilitate semiconductor device fabrication without measuring implantation on the actual wafer but rather by calibrating a workpiece processing device with respect to ion beams trajectories. In addition, while illustrated below in systems having so-called serial end stations, the invention may also be employed in ion implantation systems having batch end-stations, wherein all such variant implementations are contemplated as falling within the scope of the present invention and the appended claims.

Figure 3:
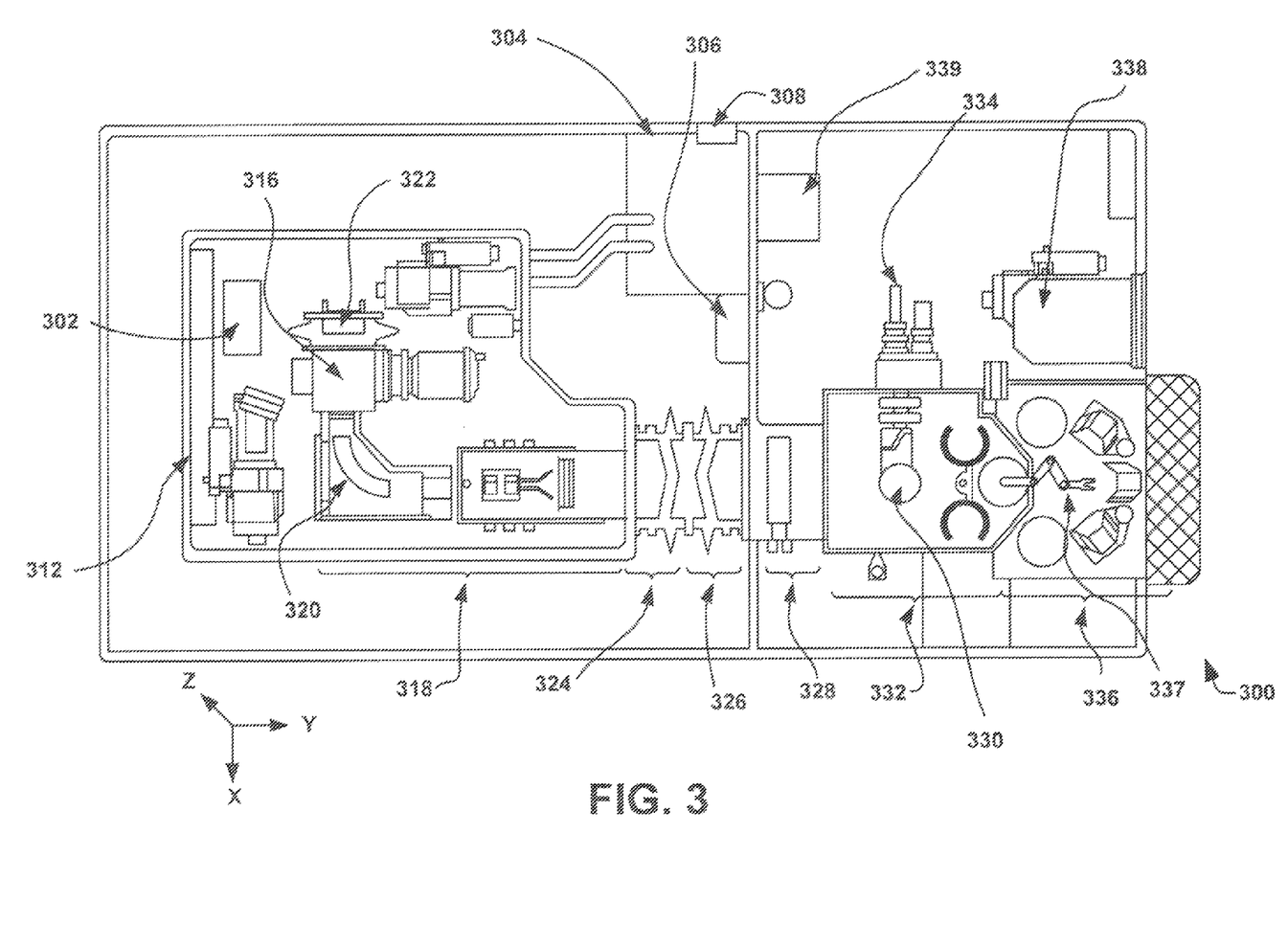
FIG. 3 is a top view of a serial wafer ion implantation system that utilizes a beam angle measurement apparatus according to at least one aspect of the present invention.
Figure 4:
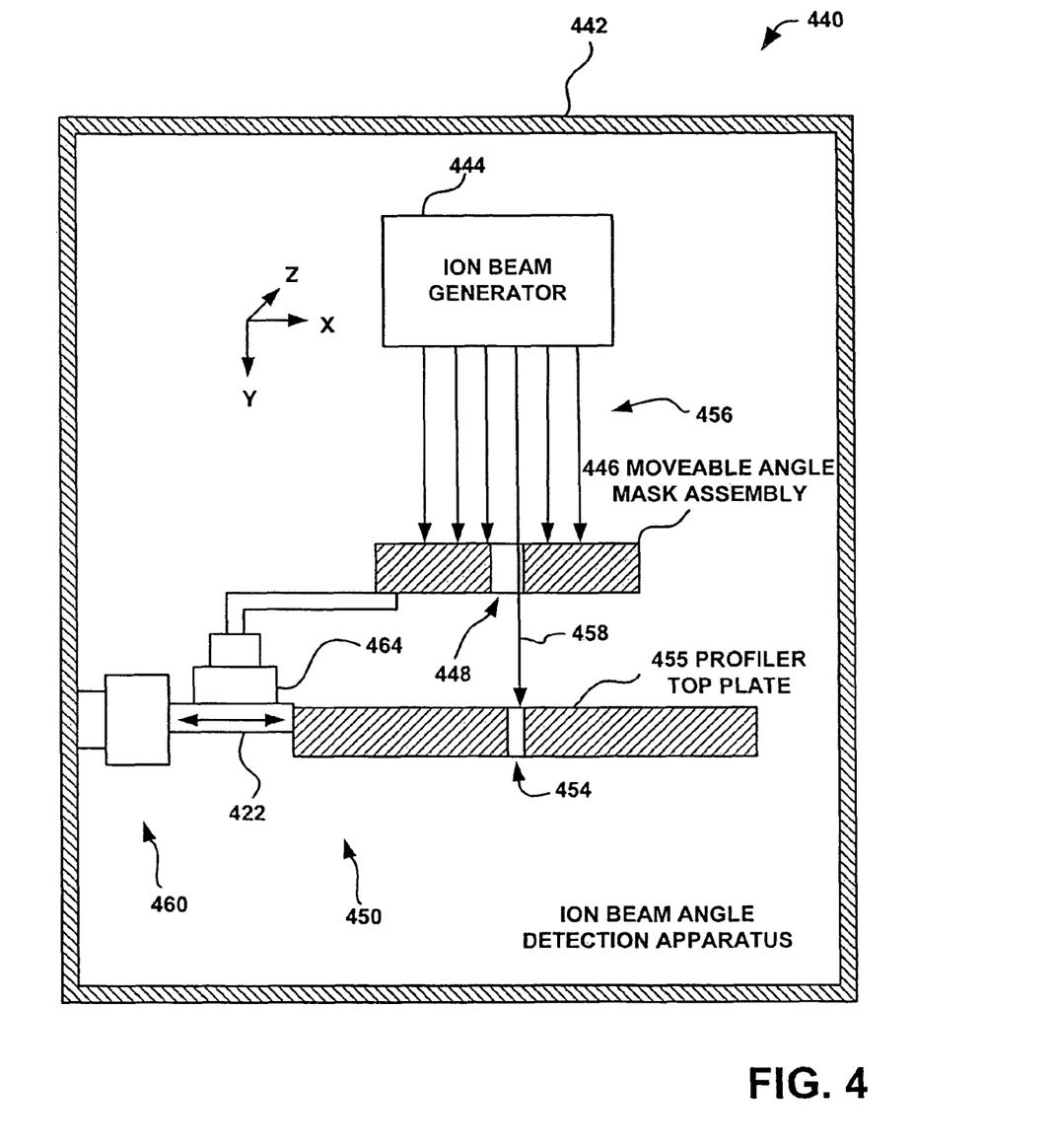
FIG. 4 is a simplified schematic diagram of an ion implantation system ion beam angle detection apparatus in accordance with another aspect of the present invention.

Referring initially to FIGS. 3 and 4, illustrated is a typical ion implantation system 300 such as may utilize an ion beam angle detection apparatus according to one aspect of the present invention. The ion implantation system 300 is operable to scan a workpiece 330 (e.g., a semiconductor substrate or wafer) relative to an ion beam, therein implanting ions into the workpiece 330. FIG. 4 represents a schematic of an ion beam angle detection apparatus 440 that utilizes a moveable profiler assembly along with a moveable angle mask assembly 450 for measuring the beam angle at any point along the broad direction of the ion beam 456.

The system 300 (FIG. 3) includes modular gas boxes 302 and 306, and a gas box remote purge control panel 308. The gas boxes 304 and 306 comprise, among other things, one or more gases of a dopant substance, and the boxes 304, 306 facilitate selective delivery of the gas(es) into an ion source 322 within the system 300, wherein the gas(es) can be ionized to generate ions suitable for implantation into a wafer or workpiece 330 selectively brought into the system 300. The gas box remote control panel 308 facilitates venting or purging gas(es) or other substances out of the system 300 on an as needed or desired basis.

High voltage terminal power distribution 312 and a high voltage isolation transformer 314 are included to, among other things, electrically excite and impart energy to the dopant gas(es) to generate ions from the gas(es). An ion beam extraction assembly 316 is included to extract ions from the ion source 322 and accelerate them into a beamline 318 region illustrated by the bracket, which includes a mass analysis magnet 320. The mass analysis magnet 320 is operable to sort out or reject ions of an inappropriate charge-to-mass ratio. In particular, the mass analysis magnet 320 comprises a guide having sidewalls with which ions of an undesired mass-to-charge ratio collide as they are propagated through the beamguide by way of one or more magnetic fields generated by magnet(s) of the mass analysis magnet 320.

A component 324 may be included to assist with controlling the angle of the scanned ion beam 456 (FIG. 4). This may include, among other things, a scan angle correction lens. An acceleration/deceleration column 326 facilitates controlling and adjusting the speed, and/or focusing, of ions within the ion beam. A component 328 operable to filter out contaminant particles, such as a final energy filter is also included in accordance with one or more aspects of the present invention to mitigate energy contaminating particles from encountering the workpiece 330.

Wafers and/or workpieces 330 are loaded into an end station chamber 332 for selective implantation with ions. A mechanical scan drive 334 maneuvers the workpieces 330 within the chamber 332 to facilitate selective encounters with the ion beam. The wafers or workpieces 330 are moved into the end station chamber 332 by a workpiece handling system 336, which may include, for example, one or more mechanical or robotic arms 337. An operator console 338 allows an operator to regulate the implantation process by selectively controlling one or more components of the system 300 or 340. Finally, a power distribution box 339 is included to provide power to the overall system 300.

Figure 5:
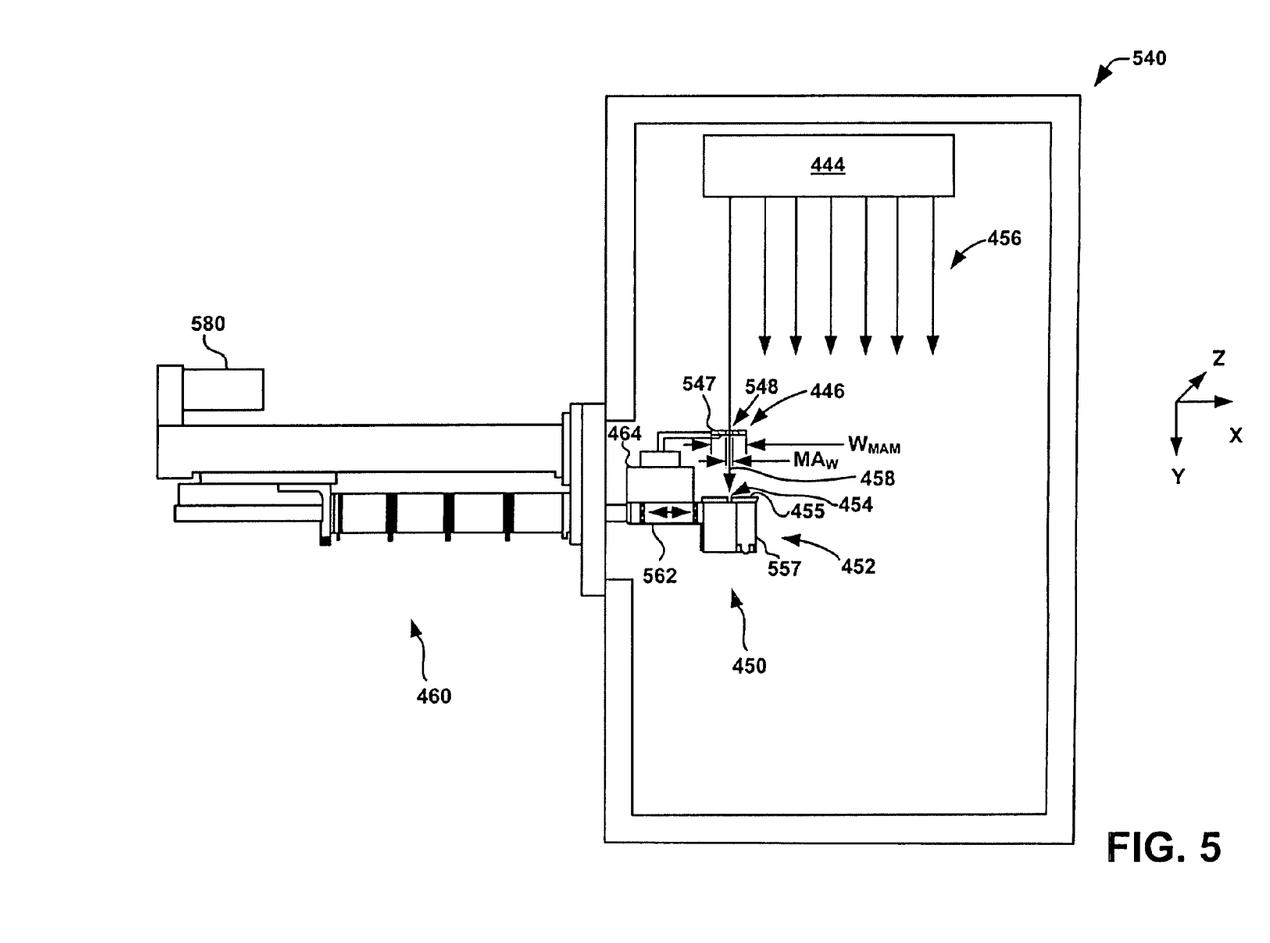
FIGS. 5-7 are partial side elevation views illustrating variations in the ion beam angle detection apparatus in accordance with yet another aspect of the present invention.

FIG. 4 is a simplified schematic diagram of an ion beam angle detection apparatus 440 in accordance with an aspect of the present invention. The apparatus 440 comprises an evacuated process chamber 442, an ion beam generator 444, a moveable angle mask 446 with a mask aperture 448, and a moveable profiler assembly 450 with a profiler 452 (FIG. 5) having a profiler aperture 454, a profiler top plate 455 and a profiler sensor assembly 557 (FIG. 5). The width $W_{MAM}$ of the mask aperture 446 is sufficient to obstruct the passage of the ion beam 456 over a distance larger than the expected displacement of the beamlet 458 (FIG. 4) passing through the mask aperture 448 having a mask aperture width $W_{MA}$ to the profiler top plate 455. The ion beam angle detection apparatus 540 illustrated in FIG. 5 is supplied for descriptive purposes and is not intended to include all aspects, components, and features of the ion beam angle detection apparatus 540. Instead, the apparatus 540 is depicted so as to aid a further understanding of the present invention.

Referring now to FIG. 5, the ion beam generator 444 generates an ion beam 456, e.g., a ribbon beam, as discussed supra. The ion beam 456 has numerous features or attributes including but not limited to, total number of ions that impact a given surface, plasma density, cross sectional shapes, the ion species, dosages, beam currents, intensities, emittance, ion beam spot size, angles of incidence and ion beam energies. The ion beam 456 is illustrated as being approximately orthogonal to the profiler top plate 455 of the profiler 452, the ion beam 456 can be at other incident angles with the x-z planar surface of the top plate 455 (e.g., an angle δ greater than 0 degrees, where 0 degrees is defined as an ion beam or ion beamlet traveling in a path perpendicular to the profiler top plate 455 planar x-z surface).

In this embodiment, a workpiece platen can move a workpiece (not shown) through the stationary ion beam 556 (as illustrated) at controlled, directed or pre-specified rates so as to achieve desired implantation results. In an alternate aspect, the ion beam 456 can be moved across the workpiece in a single pass or multiple passes that again are controlled, directed or at a pre-specified rate. The ion beam angle detection apparatus 540 in this embodiment of the present invention is utilized to characterize the ion beam 456 prior to the performance of ion implantation of the workpiece. In other words, the ion beam angle detection apparatus 540 can characterize the ion beam properties, e.g., angle of incidence and then the ion beam 456 properties can be adjusted, measured again by the apparatus 540, prior to ion implantation of the work piece. The apparatus 540 can be moved out of the path of the ion beam 456 for the ion implantation process.

The profiler 452 in the present example is fixedly attached to a moveable angle mask 446 by a drive assembly 560 and the profiler assembly 450. The drive assembly 560 comprises a linear stage 562, a linear stage motor 580 and a mask drive 564 fixedly attached to the linear stage 562. It is appreciated that alternate aspects of the invention include any suitable number of linear drives, detectors located at other positions, movable detectors and the like. For example, a detector or detectors may be integrated into the profiler 452 and optionally anywhere on the ion beam angle detection apparatus 540, for example, on the moveable angle mask assembly 446 and in substantially the same plane as the workpiece (not shown). A detector can measure uniformity of beam current across the ion beam 456 at any number of locations, which also indicates a shape of the ion beam 456. This is a marked improvement over the current profilers that measure angles at discrete locations whereas the present invention can determine ion beam properties along the entire length of the ion beam 456. Additionally, the detector can obtain angle of incidence measurements of the ion beam 456 and/or ion beamlet 458 at a number of locations in linear direction of the beam 456.

The beam current uniformity and angle of incidence measurements can be employed to modify the ion beam 456 generated by the ion implantation system 500 to improve ion beam uniformity. If time constraints impose the need or desire for a rapid measurement the profiler 452 can measure the properties at discrete rather than continuous positions. A key aspect of this invention is that the location of the discrete measurements, however, is arbitrary, as opposed to the discrete measurements of standard profilers which occur at fixed positions.

The profiler 452 includes a series of elements that respectively include the profiler aperture 454. The aperture 454 permits only a portion of the ion beam 456, referred to as the beamlet 458, to pass through. Beamlet current measured by the sensor(s) is employed to calculate an angle of incidence δ of the beamlet 458 and, therefore, a portion of the ion beam 456. Accordingly, each of the measurements can be utilized to obtain an angle of incidence and the measurements of the elements are then used to determine uniformity of the angle of incidence throughout the ion beam 456. Further details and examples of suitable detectors in accordance with the present invention are described infra.

Figure 6:
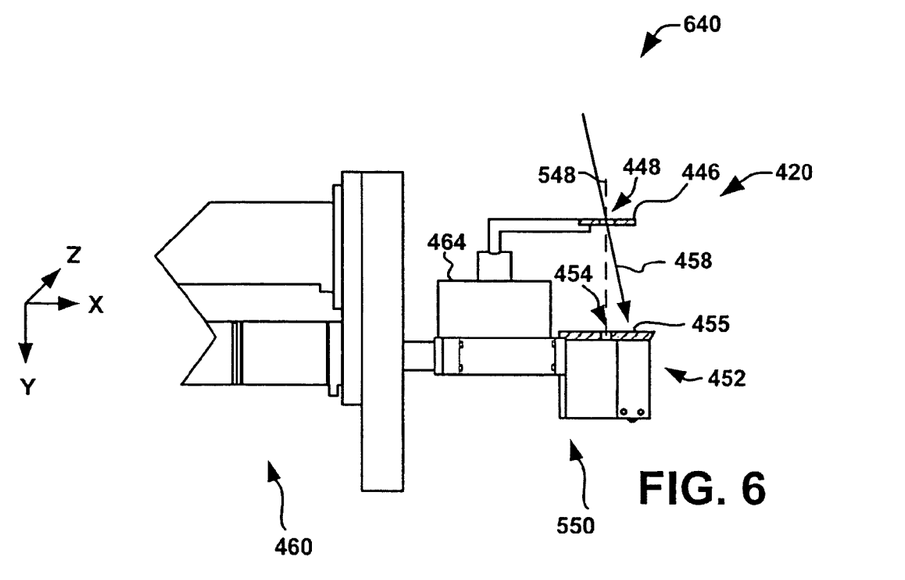
Figure 7:
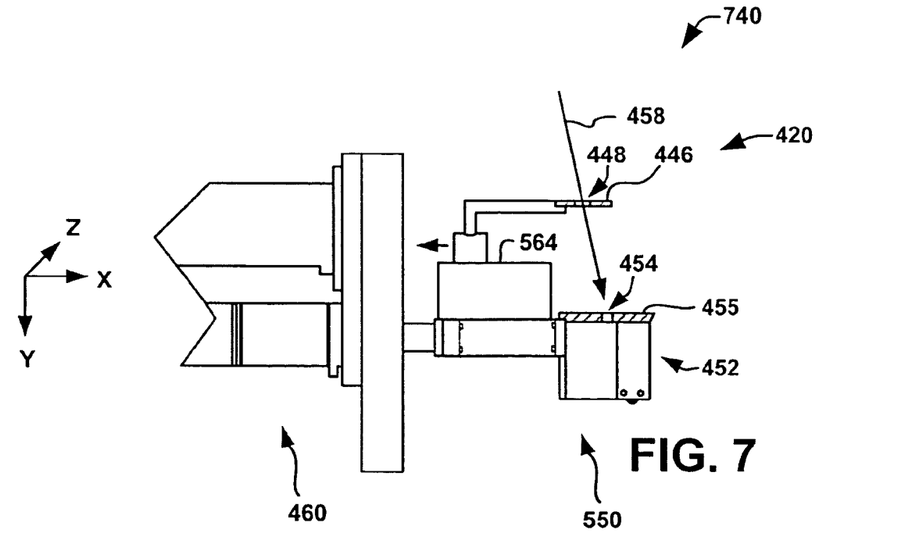

FIGS. 6 and 7 illustrate a partial side view of a ion beam angle detection apparatus 640 and a partial side view comprising a moveable angle mask assembly 420, with a moveable angle mask 446 wherein the width $W_{MAM}$ of the moveable angle mask 446 is sufficient to obstruct the passage of the ion beam 446 over a distance larger than the expected displacement of the beamlet 458 passing through the mask aperture 448 having a mask aperture width $W_{MA}$ to the profiler top plate 455. The angle mask 446 is movable rapidly (within 2 to 10 times the profiler velocity) back and forth relative to the profiler 452 by utilizing the mask drive 464. The drive 464 can comprise at least one of the following: a actuator, a rotational actuator, a stepper motor, pulsed power actuator, and the like. When the profiler 452 is finished measuring the overall beam current uniformity, the ion beam angle detection apparatus 604 has enough travel so that it can be moved completely out of the path of the incoming beam 456. The linear drive assembly 460 can also move the profiler 452 across the full width of the ion beam 456 and completely out of the path of the ion beam 456, if desired. In other words as mentioned supra, the ion beam angle detection apparatus 640 can be used between workpiece implantation to tune the ion implantation system 300 or the profiler 452 can be used during or immediately prior to ion implantation of the workpiece on the platen (not shown) to adjust ion beam dosage and ion beam angle in the x-y plane in real time.

FIG. 6 illustrates an embodiment of the present invention wherein the ion beam 456 is not perpendicular to the angle mask 446 wherein the profiler 452 would measure zero current for such an extreme angle 6 even though the angle mask aperture 448 and the profiler aperture 454 are vertically aligned along the z axis illustrated by the dashed center line 548. FIG. 7 illustrates yet another embodiment of the present invention wherein the ion beam path is not perpendicular to the angle mask 446 wherein the profiler 452 would measure current for such an extreme angle δ because the angle mask 446 and therefore the mask aperture 448 are moved by the mask drive 464 so that the beamlet 458 passes through the mask aperture 448 and the profiler aperture 454, as illustrated. The profiler 452 moves across the ion beam in a linear motion at relatively slow speed (typically 0.1 m/s but can be as fast as 1 m/s), whereas the mask 446 moves in a relatively rapid (2 to 10 times the profiler velocity) motion back and forth about the profiler 452.

Figure 8:
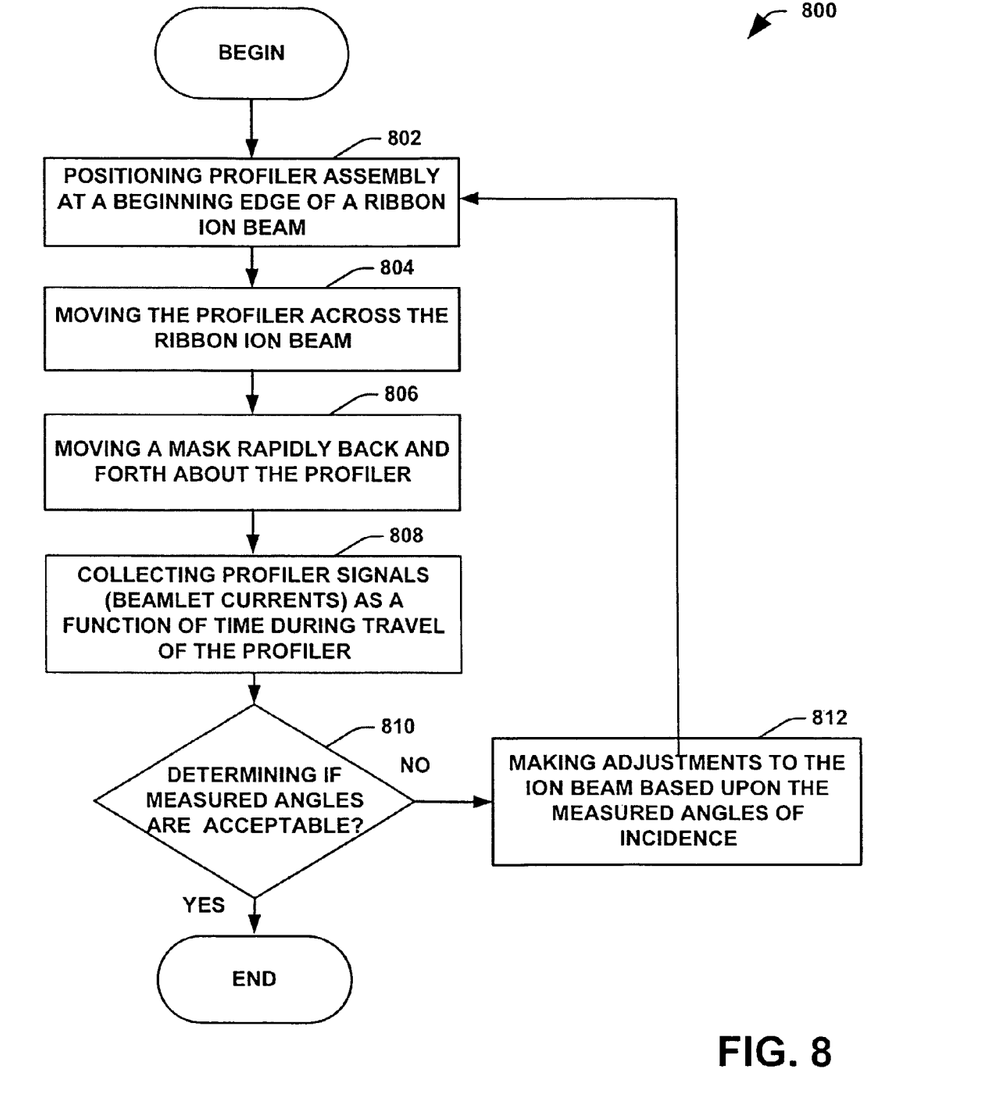
FIG. 8 is a functional block diagram illustrating a method of measuring ion beam angles according to yet another embodiment of the present invention.

For illustrative purposes, a general method for measurement of beam angle in ion implantation is illustrated in FIG. 8 and will be described in conjunction with FIGS. 4-7. While this method is illustrated and described below as a series of acts or events, it will be appreciated that the present invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects or embodiments of the present invention. Further, one or more of the acts depicted herein may be carried out in one or more separate acts and/or phases.

FIG. 8 shows one exemplary method 800 for measurement of ion beam angle in ion implantation as taught by the current invention. The method begins at 802; a profiler 452 is positioned at the beginning edge of a ribbon ion beam 456 or at a predetermined starting location on the x axis, for example. At 804, the profiler 452 is moved across the ion beam 456 at, for example, a slow speed (typically 0.1 m/s but can be as fast as 1 m/s). At 806 a mask 446 is moved rapidly (2 to 10 times the profiler velocity) back and forth about the profiler 452. Those skilled in the art will appreciate that the speed of the profiler 452 and the mask 446 can be adjusted and all speeds are contemplated herein. It should be further appreciated that 804, 806 and 808 can occur simultaneously. In another embodiment of the present invention, an actual angle of incidence $\delta_A$ of a beamlet 458 or the beam 456 can be measured at discrete locations along the ribbon ion beam rather than continuously. Continuing with method 800 at 808 profiler signals (i.e., beamlet currents) as a function of time are collected during the travel of the profiler 452 (e.g., approximating a sine wave). Based upon the profiler signals an angular distribution of the ribbon beam 456 can be determined.

At 810 the actual angle of incidence $\delta_A$ is not within the specified acceptable range the method proceeds to 812 wherein making adjustments to the ion beam 456 based upon the measured angles of incidence and the method 800 returns to 802. If the actual angle of incidence $\delta_A$ is within specification then the method 800 ends.

Although the invention has been illustrated and described with respect to one or more implementations, alterations and/or modifications may be made to the illustrated examples without departing from the spirit and scope of the appended claims. In particular regard to the various functions performed by the above described components or structures (blocks, units, engines, assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method for evaluating a ribbon shaped ion beam, comprising:
    moving a profiler assembly having a profiler aperture across at least a portion of a width of the ribbon ion beam, wherein the profiler assembly is configured to generate a profiler signal that is a function of a portion of the ribbon ion beam that passes through the profiler aperture;
    moving a mask having a mask aperture rapidly back and forth about the profiler assembly, wherein the mask is positioned between the incoming ribbon ion beam and the profiler assembly; and
    collecting profiler signals as a function of time during travel of the profiler assembly across the width of the ribbon ion beam.

2. The method of claim 1, further comprising determining a beam angle of the ribbon shaped ion beam along the width thereof based on the collected profiler signals.

3. A beam angle measurement assembly, comprising:
    an ion beam profiler comprising a profiler aperture configured to selectively permit a portion of a ribbon shaped ion beam to pass therethrough and measure a beam current associated therewith, wherein the profiler is configured to translate laterally across a width of the ribbon shaped ion beam at a first translation rate; and an angle mask assembly comprising a mask aperture, wherein the angle mask assembly is positioned between the incoming ribbon shaped ion beam and the ion beam profiler, and is configured to translate laterally across the width of the ribbon shaped ion beam at a second translation rate that is different than the first translation rate, wherein the second translation rate is greater than the first translation rate.

4. The assembly of claim 3, wherein the angle mask assembly is configured to translate back and forth a distance associated with a width of the ion beam profiler in a direction along a width of the ribbon ion beam as the ion beam profiler translates in the direction along the width of the ribbon ion beam.

* * * * *